United States Patent
Ito et al.

(10) Patent No.: US 11,217,745 B2
(45) Date of Patent: Jan. 4, 2022

(54) MAGNETORESISTIVE MEMORY DEVICE AND METHOD FOR MANUFACTURING MAGNETORESISTIVE MEMORY DEVICE

(71) Applicant: TOSHIBA MEMORY CORPORATION, Tokyo (JP)

(72) Inventors: Yuichi Ito, Yokkaichi Mie (JP); Kouji Matsuo, Ama Aichi (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 45 days.

(21) Appl. No.: 16/352,393

(22) Filed: Mar. 13, 2019

(65) Prior Publication Data
US 2020/0083443 A1   Mar. 12, 2020

(30) Foreign Application Priority Data

Sep. 6, 2018 (JP) .............................. JP2018-166841

(51) Int. Cl.
| H01L 43/12 | (2006.01) |
|---|---|
| H01L 43/02 | (2006.01) |
| H01L 27/22 | (2006.01) |
| G11C 11/16 | (2006.01) |
| H01L 43/10 | (2006.01) |

(52) U.S. Cl.
CPC .............. *H01L 43/12* (2013.01); *G11C 11/161* (2013.01); *H01L 27/228* (2013.01); *H01L 43/02* (2013.01); *H01L 43/10* (2013.01)

(58) Field of Classification Search
CPC ..... H01L 43/12; H01L 21/3065; H01L 43/02; H01L 27/228; H01L 43/10; G11C 11/161
See application file for complete search history.

(56) References Cited

U.S. PATENT DOCUMENTS

| 9,129,690 | B2 | 9/2015 | Park et al. |
| 9,406,876 | B2 | 8/2016 | Pinarbasi |
| 9,601,688 | B2 | 3/2017 | Ikeda |
| 2014/0063924 | A1 | 3/2014 | Nakai et al. |
| 2015/0104882 | A1* | 4/2015 | Jung ................. H01L 43/12 |
| | | | 438/3 |
| 2017/0243919 | A1* | 8/2017 | Seong ............... H01L 45/144 |
| 2018/0040814 | A1* | 2/2018 | Park ................. H01L 27/228 |

FOREIGN PATENT DOCUMENTS

| JP | 2005159240 A | 6/2005 |
| JP | 2014022751 A | 2/2014 |
| JP | 2014049497 A | 3/2014 |
| JP | 5647351 B2 | 12/2014 |
| WO | 2017155508 A1 | 9/2017 |

OTHER PUBLICATIONS

Linda M. Ephrath, Reactive Ion Etching for VLSI, IEEE Transactions on Electron Devices, vol. ED-28, No. 11, Nov. 1981, pp. 1315-1319 (Year: 1981).*

* cited by examiner

*Primary Examiner* — Shih Tsun A Chou
(74) *Attorney, Agent, or Firm* — Holtz, Holtz & Volek PC

(57) ABSTRACT

According to one embodiment, a method for manufacturing a magnetoresistive memory device includes forming a first layer stack on a substrate. A second layer stack including a first ferromagnet is formed on the first layer stack. A mask including a first portion and an opening is formed above the second layer stack. The second layer stack is etched with an ion beam that travels through the opening. The first layer stack is etched by reactive ion etching through the opening.

16 Claims, 9 Drawing Sheets

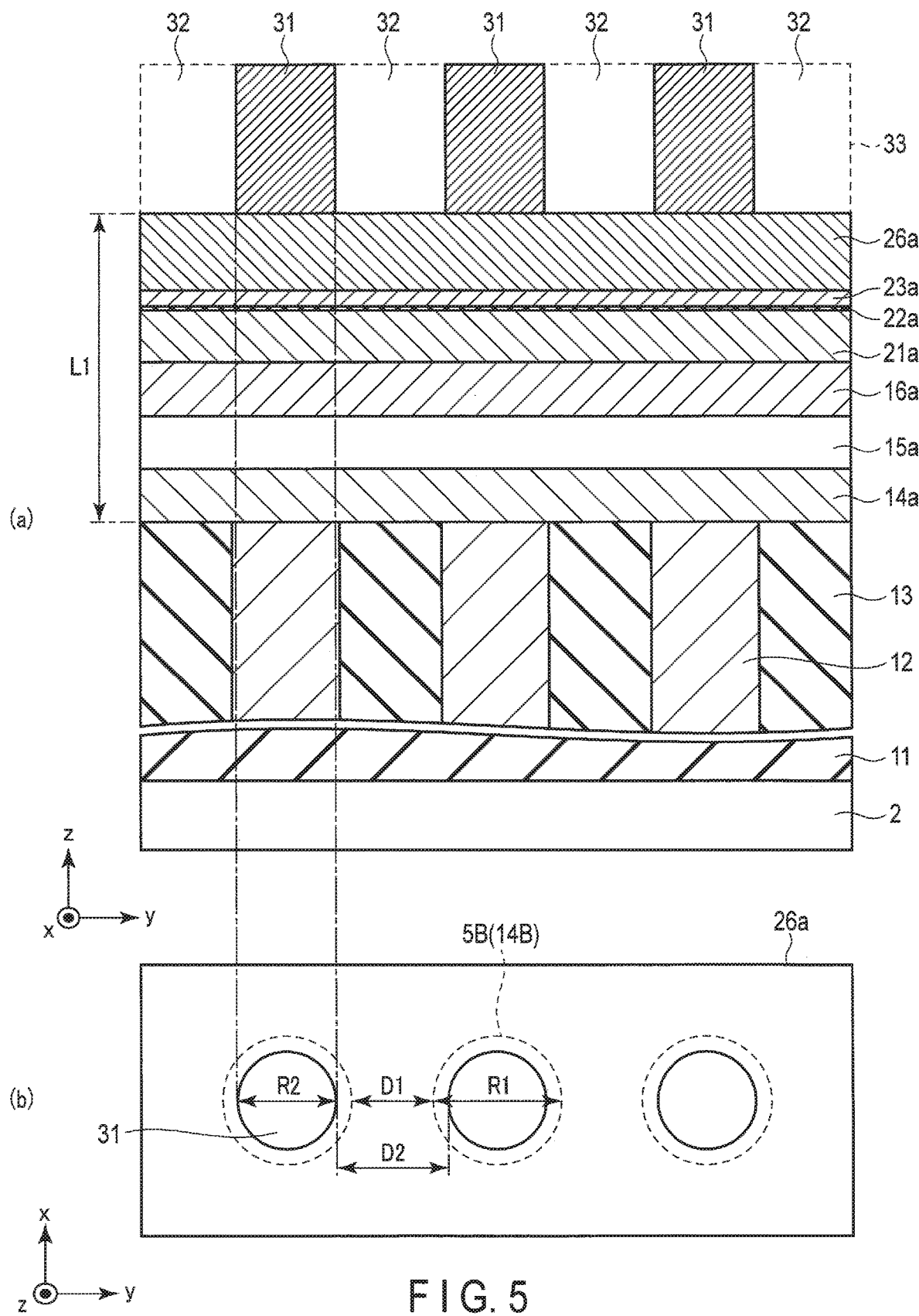
F I G. 5

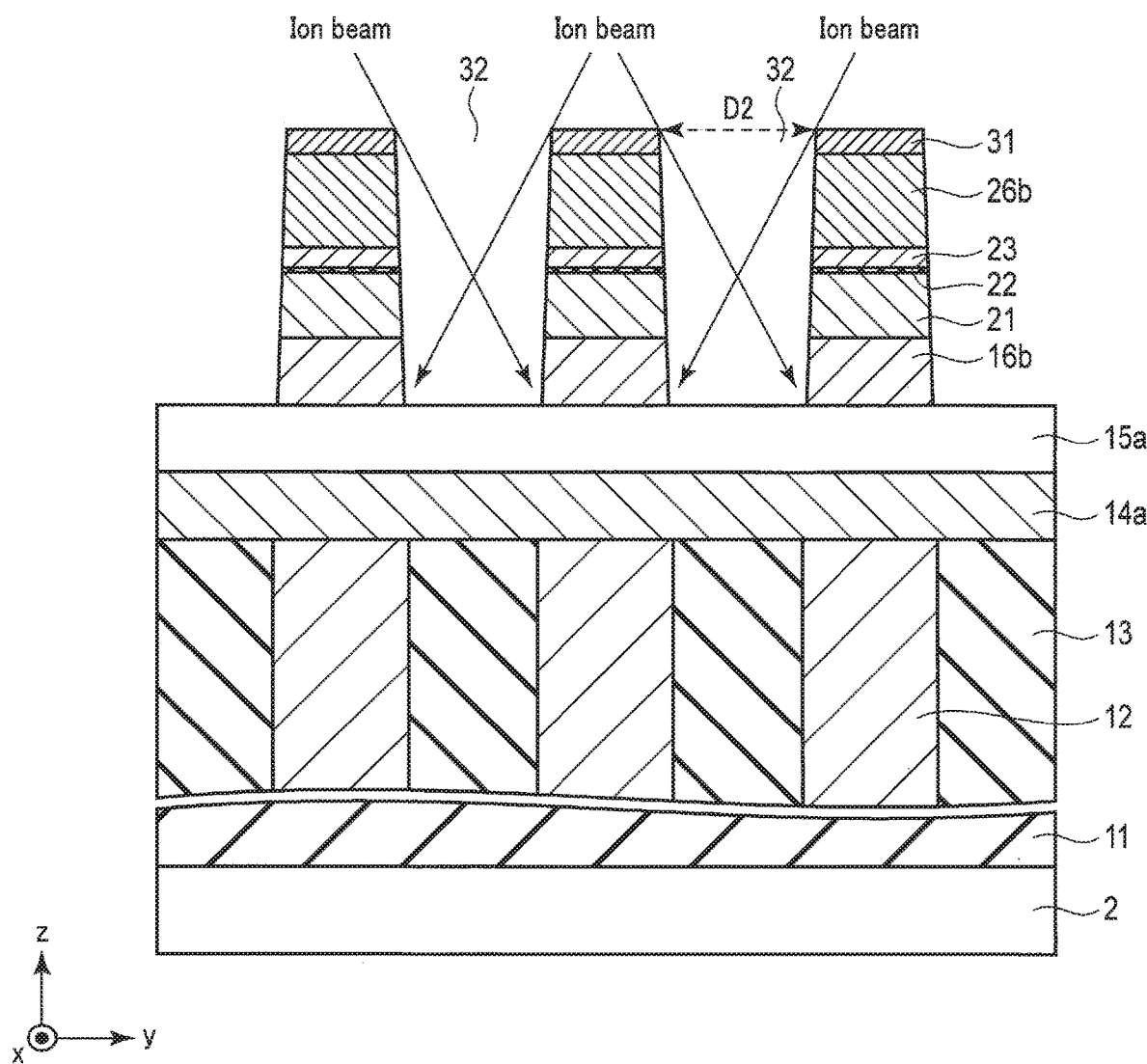
F I G. 10

MAGNETORESISTIVE MEMORY DEVICE AND METHOD FOR MANUFACTURING MAGNETORESISTIVE MEMORY DEVICE

CROSS-REFERENCE TO RELATED APPLICATIONS

This application is based upon and claims the benefit of priority from Japanese Patent Application No. 2018-166841, filed Sep. 6, 2018, the entire contents of which are incorporated herein by reference.

FIELD

Embodiments generally relate to a magnetoresistive memory device and a method for manufacturing a magnetoresistive memory device.

BACKGROUND

There is a known memory device that stores data using a magnetoresistive effect.

BRIEF DESCRIPTION OF THE DRAWINGS

FIG. 5 shows a state subsequent to FIG. 4 during the manufacturing process of the magnetoresistive memory device according to the first embodiment;

FIG. 10 shows a state during a referential manufacturing process of a magnetoresistive memory device.

DETAILED DESCRIPTION

Figure 1:
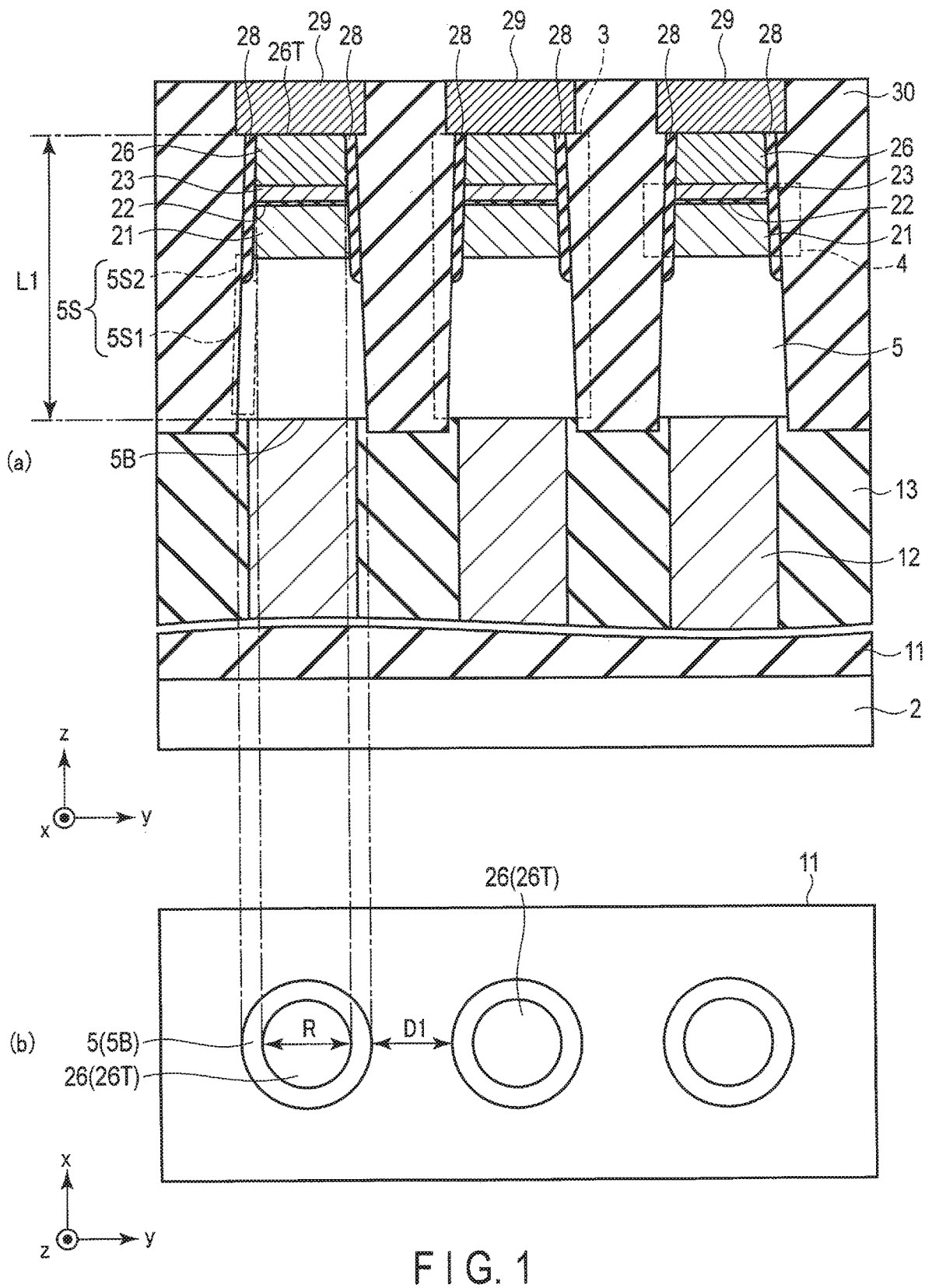
FIG. 1 is a cross-sectional view showing a part of a structure of a magnetoresistive memory device according to a first embodiment.

According to one embodiment, a method for manufacturing a magnetoresistive memory device includes forming a first layer stack on a substrate. A second layer stack including a first ferromagnet is formed on the first layer stack. A mask including a first portion and an opening is formed above the second layer stack. The second layer stack is etched with an ion beam that travels through the opening. The first layer stack is etched by reactive ion etching through the opening.

Embodiments will now be described with reference to the figures. In the following description, components with substantially the same functionalities and configurations will be referred to with the same reference numerals, and repeated descriptions may be omitted. The figures are schematic, and the relations between the thickness and the area of a plane of a layer and ratios of thicknesses of layers may differ from actual ones. Therefore, specific thickness and size should be determined in consideration of the following description. Moreover, the figures may include components which differ in relations and/or ratios of dimensions in different figures. Each embodiment illustrates the device and method for materializing the technical idea of that embodiment, and the technical idea of an embodiment does not specify the quality of the material, shape, structure, arrangement of components, etc. to the following.

First Embodiment

FIG. 1 shows a part of a structure of a magnetoresistive memory device 1 according to a first embodiment. In the drawing, a part (a) shows a cross-sectional structure along the y-z plane, and a part (b) shows a planar structure along the x-y plane. The part (b) shows only some of the components shown in the part (a).

As shown in FIG. 1, the magnetoresistive memory device 1 includes a substrate 2 and memory cells 3 above a surface of the substrate 2 along the x-y plane. FIG. 1 shows three memory cells 3. Each memory cell 3 includes at least a variable resistance element 4, a layer stack 5, and a capping film 26, and may include other layers as well. The structure of the magnetoresistive memory device 1 will now be described in more detail.

Each memory cell 3 has, for example, a truncated cone shape.

An insulator 11 is provided on the surface of the substrate 2 along the x-y plane. Conductors 12 are provided above the insulator 11 along the z-axis. The conductors 12 are independent of each other. Between the conductors 12, an insulator 13 is provided.

A layer stack 5 is placed on an upper surface of each conductor 12. A lower surface 5B of the layer stack 5 is placed on the upper surface of the conductor 12. The layer stacks 5 are independent of each other. Each layer stack 5 includes layers stacked along the z-axis. Each layer stack 5 may include any kind of layers based on a design of the magnetoresistive memory device 1.

Each layer stack 5 has a tapered shape and includes a side surface 5S inclined relative to the z-axis. The side surface 5S includes a first section 5S1 and a second section 5S2. The second section 5S2 is placed above the first section 5S1, being connected to an upper surface of the layer stack 5. The second section 5S2 does not lie on an extension of the first section 5S1. In the layer stack 5, a portion including the second section 5S2 has a diameter (i.e., a length along the x-y plane) smaller than that of a portion including the first section 5S1. More specifically, any portion of the second section 5S2 including a lower end has a diameter smaller than that of an upper end of the first section 5S1. FIG. 1 shows an example in which a boundary between the first section 5S1 and the second section 5S2 is placed on the side surface 5S slightly lower than the upper surface of the layer stack 5.

A variable resistance element 4 is placed on the upper surface of each layer stack 5. The variable resistance elements 4 are independent of each other. Each variable resistance element 4 has a tapered shape and includes a side surface inclined relative to the z-axis. The side surface of the variable resistance element 4 lies on an extension of the second section 5S2 of the side surface 5S of the layer stack 5. Each variable resistance element 4 may have two switchable resistances and includes layers stacked along the z-axis. Each variable resistance element 4 may include any kind of layers based on a feature of the variable resistance element 4.

An example of the variable resistance element 4 includes a magnetic tunnel junction (MTJ) element including two ferromagnets. FIG. 1 shows such an example, and the following embodiment will be described based on the example where the variable resistance elements 4 are MTJ elements. Hereinafter, the variable resistance elements 4 may be referred to as "MTJ elements 4".

Provided that the variable resistance elements 4 are MTJ elements, for example, each MTJ element 4 includes a ferromagnet 21, an insulating nonmagnet 22, and a ferromagnet 23. The ferromagnet 21 is placed on the upper surface of the layer stack 5, the nonmagnet 22 is placed on the ferromagnet 21, and the ferromagnet 23 is placed on the nonmagnet 22. During normal operations of the magnetoresistive memory device 1, a magnetization direction of the ferromagnet 21 is invariable, while a magnetization direction of the ferromagnet 23 is variable. The ferromagnets 21 and 23, for example, have a magnetization easy axis along a direction penetrating interfaces between the ferromagnet 21, the nonmagnet 22, and the ferromagnet 23. The set of the ferromagnet 21, the nonmagnet 22, and the ferromagnet 23 exhibits a magnetoresistive effect. Specifically, when the magnetization directions of the ferromagnets 21 and 23 are parallel, the MTJ element 4 shows the smaller one of the two resistances. On the other hand, when the magnetization directions of the ferromagnets 21 and 23 are antiparallel, the MTJ element 4 shows the larger one of the two resistances. States indicating two different resistances may be assigned to binary data, respectively.

When a write current of a certain magnitude flows from the ferromagnet 23 toward the ferromagnet 21, the magnetization direction of the ferromagnet 23 becomes parallel to the magnetization direction of the ferromagnet 21. On the other hand, when a write current of a certain magnitude flows from the ferromagnet 21 toward the ferromagnet 23, the magnetization direction of the ferromagnet 23 becomes antiparallel to the magnetization direction of the ferromagnet 21.

On an upper surface of each MTJ element 4, a capping film 26 is provided. The capping films 26 are conductors, functioning as protection of the MTJ elements 4 from etching during the formation of the memory cells 3. Each capping film 26 has a tapered shape and includes a side surface inclined relative to the z-axis. The side surface of each capping film 26 lies one an extension of the side surface of each MTJ element 4. Each capping film 26 includes an upper surface 26T.

A conductor 29 is provided on the upper surface 26T of each capping film 26.

In each memory cell 3, an insulator 28 is provided on the second section 5S2 of the side surface 5S of the layer stack 5, on the side surface of the MTJ element 4, on the side surface of the capping film 26, and on a part of a side surface of the conductor 29. Each insulator 28 is continuous over the second section 5S2 of the side surface 5S of the layer stack 5, the side surface of the MTJ element 4, and the side surface of the capping film 26. A surface of each insulator 28 lies on an extension of the first section 5S1 of the side surface 5S of the layer stack 5. In other words, for example, a side surface of each insulator 28 and the first section 5S1 of the side surface 5S of the layer stack 5 are continuous. Each insulator 28 includes a material containing, for example, silicon nitride and/or silicon oxide.

An insulator 30 is provided in areas of the magnetoresistive memory device 1 above the insulator 13 free from the layer stack 5, the MTJ element 4, the capping film 26, the insulator 28, and the conductor 29. The insulator 30 may include two or more kinds of materials.

A dimensional relation of several parts in the magnetoresistive memory device 1 satisfies the following relationship. There is a distance D1 between a lower surface 5B of a certain layer stack 5 and a lower surface 5B of a layer stack 5 adjacent to the layer stack 5. A length on the z-axis from the upper surface 26T of the capping film 26 to the lower surface 5B of the layer stack 5 is represented by L1. The relation of 1<L1/D1 is satisfied. In addition, 1<L1/R may also be satisfied, where R represents the diameter of the upper surface 26T of the capping film 26.

An example of the layer stack 5 will now be described. Each layer stack 5 may include a switching element. The switching element may be, for example, a switch element between two terminals. For example, when a voltage applied between the two terminals is equal to or less than a threshold, the switch element is in a "high resistance" state, for example, electrically nonconducting state. When a voltage applied between the two terminals is equal to or higher than the threshold, the switch element switches into a "low resistance" state, for example, electrically conducting state. The switch element may have this function regardless of polarity of a voltage. In other words, in either case, when a positive voltage is applied between the two terminals or when a negative voltage is applied therebetween, the switch element may have the function without dependence on polarity. The switch element may contain at least one chalcogen element selected from the group consisting of tellurium (Te), selenium (Se), and sulfur (S). Alternatively, the switch element may contain a chalcogenide, a compound containing the chalcogen element. In addition to those elements, the switch element may also contain at least one element selected from the group consisting of boron (B), aluminum (Al), gallium (Ga), indium (In), carbon (C), silicon (Si), germanium (Ge), tin (Sn), arsenic (As), phosphorus (P), and antimony (Sb). The after-mentioned switching element may also employ the switch element between the two terminals.

Figure 2:
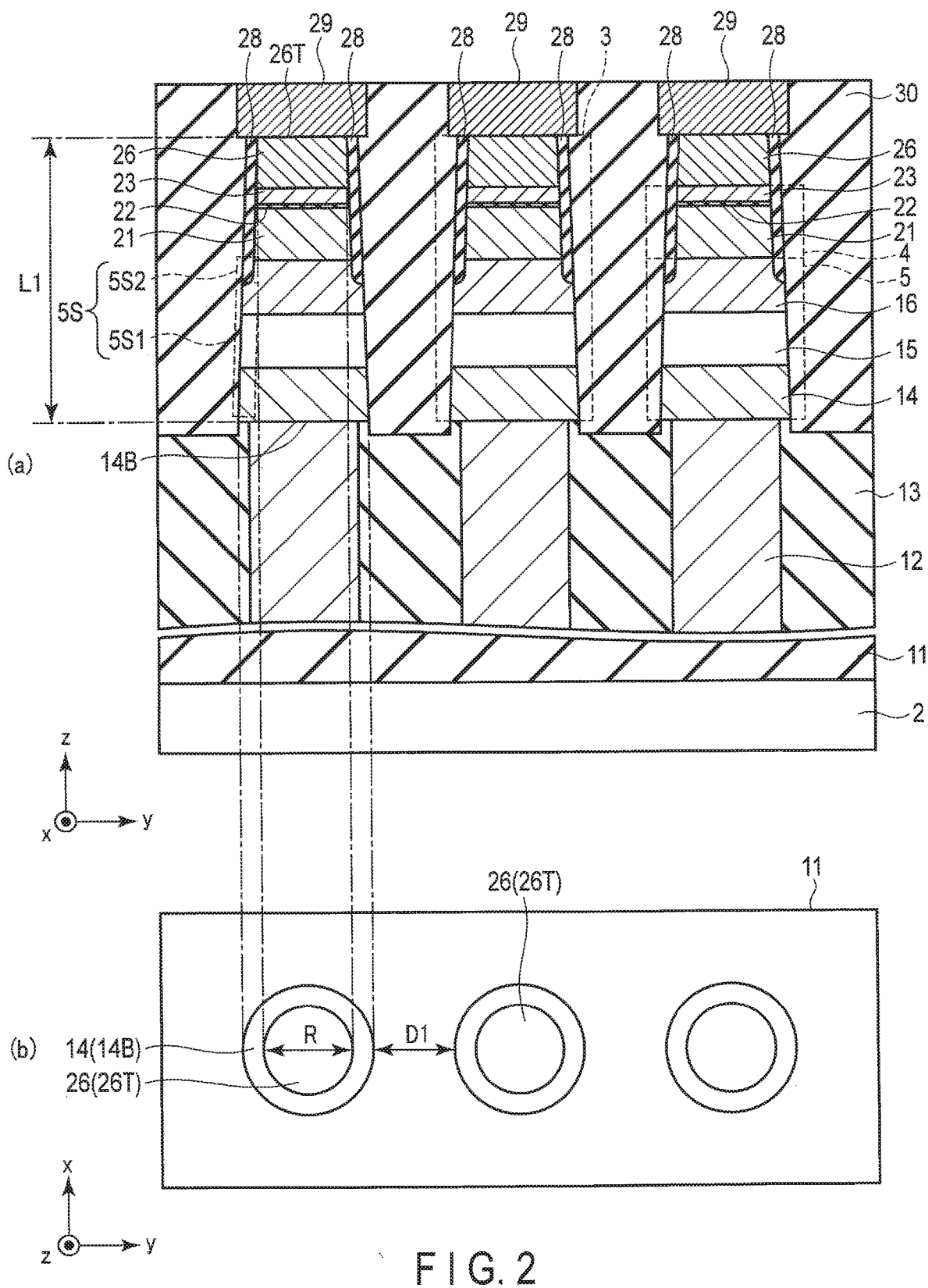
FIG. 2 shows cross-sections of parts of an exemplary structure of the magnetoresistive memory device according to the first embodiment.

In a case where each layer stack 5 includes a switching element, the layer stack 5 may further include conductors that sandwich the switching element. FIG. 2 shows an example in which each layer stack 5 includes a switching element and two conductors. As shown in FIG. 2, each layer stack 5 includes a conductor 14, a switching element 15 on the conductor 14, and a conductor 16 on the switching element 15. The conductors 14 and 16 are used, for example, to suppress conduction of heat generated in the switching element 15 to other layers. One or both of the conductors 14 and 16 may contain carbon as a component. In the example shown in FIG. 2, a lower surface 14B of the conductor 14 corresponds to the lower surface 5B of the layer stack 5. In the example shown in FIG. 2, a boundary between the first section 5S1 and the second section 5S2 is placed on a side surface of the conductor 16.

With reference to FIGS. 2 to 10, a description will be made of a method for manufacturing the magnetoresistive memory device according to the first embodiment. FIGS. 3 to 10 sequentially show states during a manufacturing process of the magnetoresistive memory device 1, specifically, states during a manufacturing process of the magnetoresistive memory device 1 that includes the layer stacks 5 having the structure shown in FIG. 2.

Figure 3:
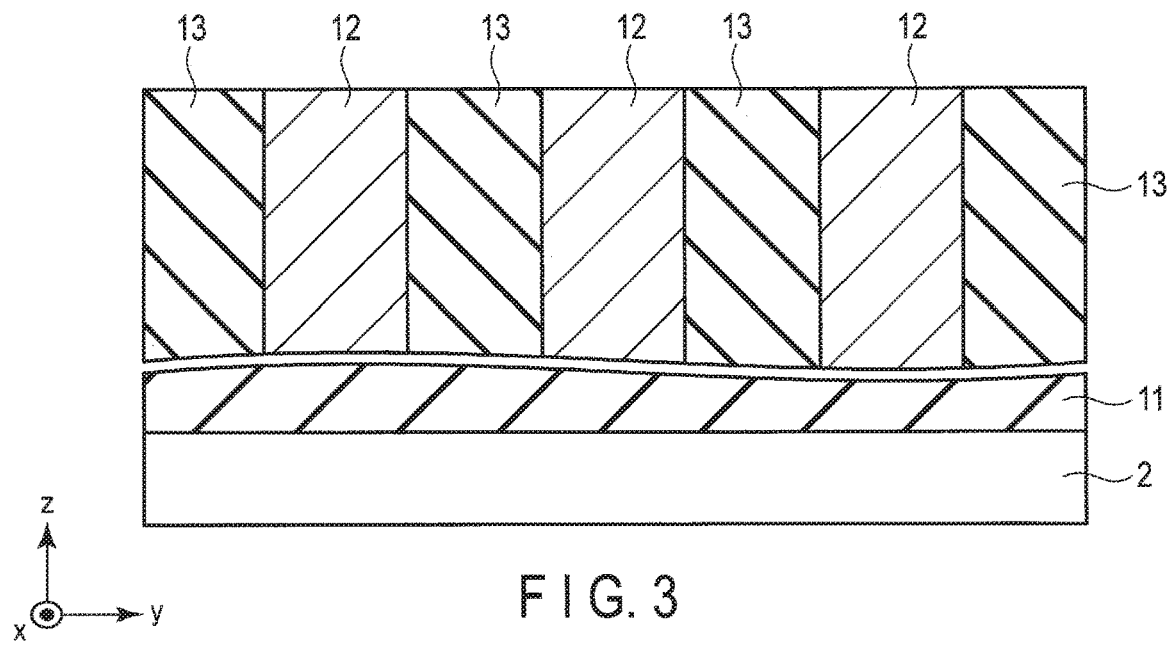
FIG. 3 shows a state during a manufacturing process of the magnetoresistive memory device according to the first embodiment.

As shown in FIG. 3, the insulator 11, the conductors 12, and the insulator 13 are formed on the upper surface of the substrate 2. Specifically, first, the insulator 13 is formed on the insulator 11. Next, in the insulator 13, openings are formed by lithography process and etching such as reactive ion etching (RIE) in areas where the conductors 12 are to be formed. A conductor is formed in each opening, whereby forming the conductors 12.

Figure 4:
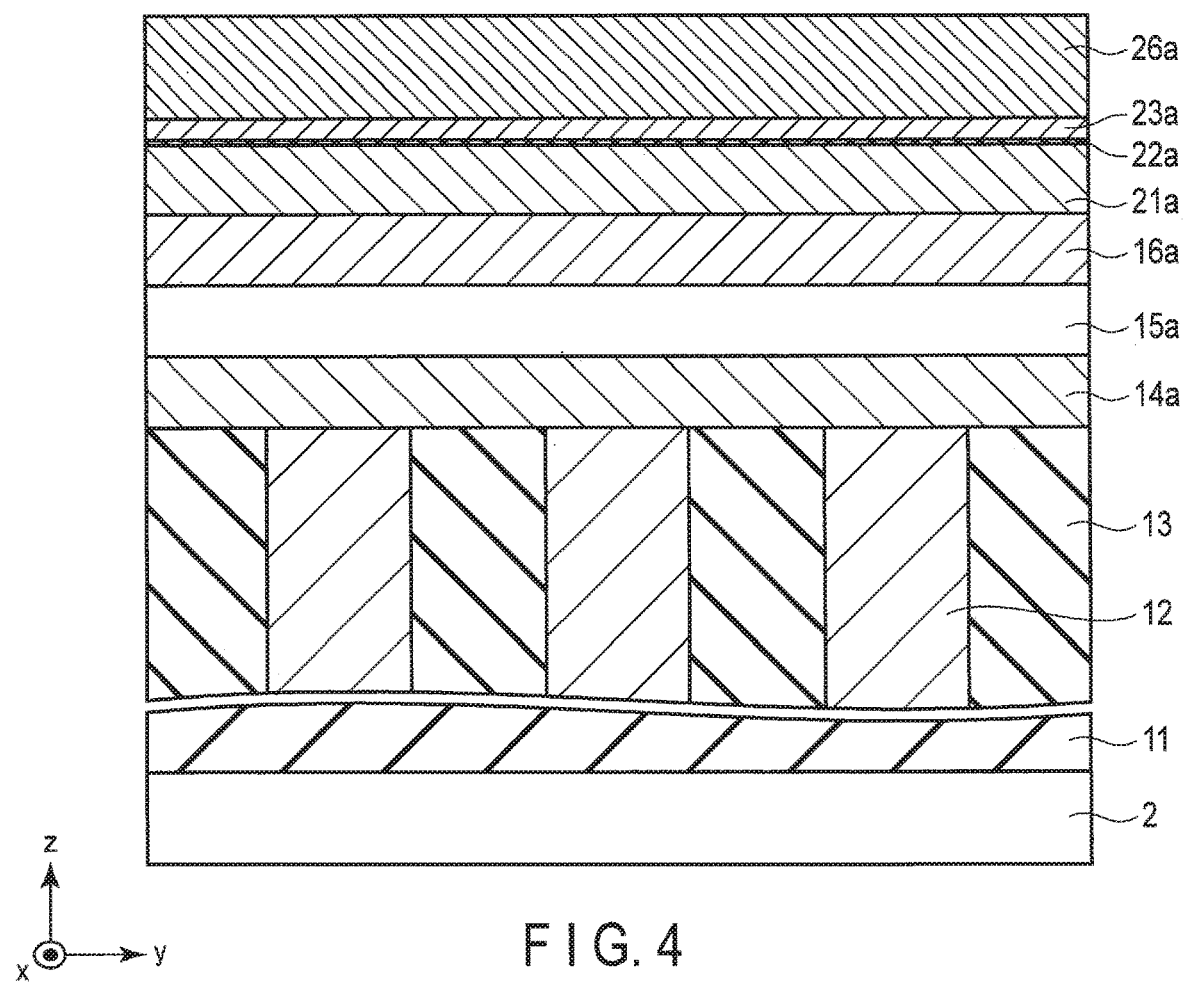
FIG. 4 shows a state subsequent to FIG. 3 during the manufacturing process of the magnetoresistive memory device according to the first embodiment.

As shown in FIG. 4, on an upper surface of the structure obtained so far in the manufacturing process, a conductor 14a, a layer 15a, a conductor 16a, a ferromagnet 21a, the nonmagnet 22a, a ferromagnet 23a, and a conductor 26a are stacked in this order. The conductor 14a, the layer 15a, the conductor 16a, the ferromagnet 21a, the nonmagnet 22a, the ferromagnet 23a, and the conductor 26a are materials to be partially removed in a process afterward to be processed into the conductor 14, the switching element 15, the conductor 16, the ferromagnet 21, the nonmagnet 22, the ferromagnet 23, and the capping film 26, respectively.

As shown in FIG. 5, a mask material 33 is formed on the entire upper surface of the conductor 26a. In FIG. 5, a part (a) shows a cross-sectional structure along the x-z plane at a position corresponding to the part (a) in FIG. 2, and a part (b) shows a planar structure along the x-y plane at a position corresponding to the part (b) in FIG. 2. The mask material 33 has mask patterns 31 that remain above areas where the MTJ elements 4 are to be formed, and the mask material 33 includes openings 32 in areas other than the mask patterns 31. Each opening 32 penetrates to the conductor 26a. Each mask pattern 31 has a very small plane area so that each memory cell 3 has a small plane area (an area of a surface along the x-y plane). In addition, a distance between adjacent mask patterns 31 is narrow, for example, R1/D1≈1 so that the memory cells 3 are densely formed. Therefore, several parts have the following dimensional relation.

Each mask pattern 31 on the x-y plane has a diameter R2 which is comparable with the diameter R1 of the lower surface 14B of each conductor 14 which is to be formed later. A length on the z-axis from the upper surface of the conductor 26a to the lower surface of the conductor 14a is equal to a length on the z-axis from the upper surface 26T of each capping film 26 to the lower surface 14B of each conductor 14, and is represented by L1. Accordingly, a ratio L1/R2 between the length L1 and the diameter R2 is high, similarly to a ratio L1/R1 between the length L1 and the diameter R1, and is for example, larger than 1.

Furthermore, it is desirable to form a distance between the memory cells 3 narrow, and in the complete magnetoresistive memory device 1, a distance between the layer stacks 5, more specifically, the distance D1 between the lower surfaces 5B of the layer stacks 5 is narrow. A distance D2 between adjacent mask patterns 31 is also narrow so as to form memory cells 3 at such a narrow distance that the distance between the lower surfaces 5B of the layer stacks 5 (or, the lower surfaces 14B of the conductors 14) becomes D1. Generally, due to etching characteristics, each memory cell 3 is formed to have a tapered shape as a result of etching. Accordingly, even though the distance D2 between the mask patterns 31 is slightly wider than the distance D1, the distance D2 is comparable with the distance D1. Thus, a ratio L1/D2 between the length L1 and the distance D2 is also high, similarly to a ratio L1/D1 between the length L1 and the distance D1.

Figure 6:
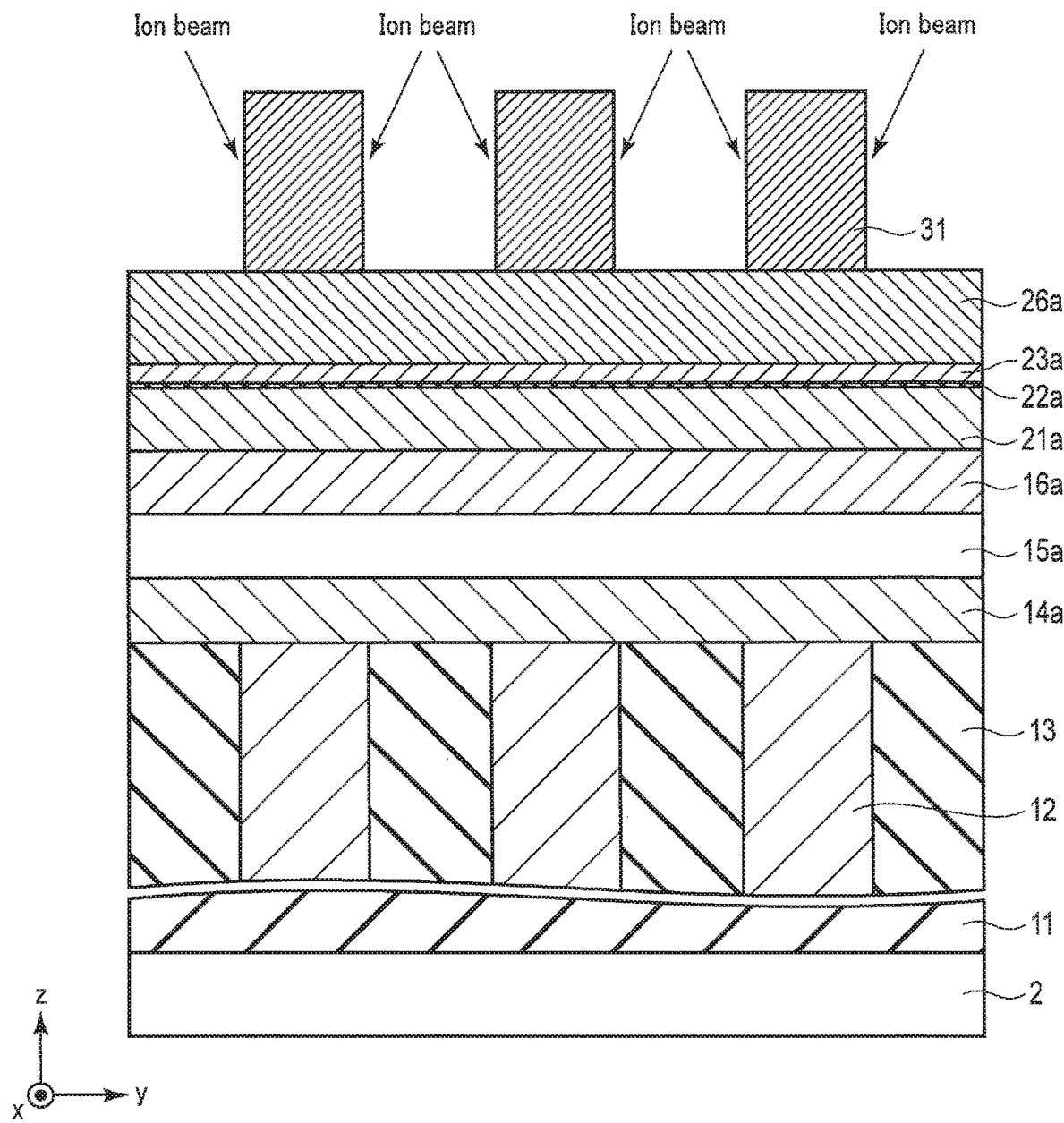
FIG. 6 shows a state subsequent to FIG. 5 during the manufacturing process of the magnetoresistive memory device according to the first embodiment.

As shown in FIG. 6, the structure obtained in the manufacturing process so far is etched by first type etching, using the mask material 33 as a mask. The first type etching does not significantly deteriorate magnetic properties of a to-be-etched material, or at least does not significantly deteriorate the to-be-etched material further than the after-mentioned second type etching. The first type etching may involve physical etching, more specifically, ion beam etching (IBE). The IBE is performed to process the ferromagnet 21a, the nonmagnet 22a, and the ferromagnet 23a into the ferromagnet 21, the nonmagnet 22, and the ferromagnet 23, respectively. The trajectories of ion beams are, for example, inclined relative to the z-axis.

Generally, the more the angle of the ion beam in IBE is oriented parallel to the z-axis (i.e., the smaller the angle relative to the z-axis is), the more likely the material etched by the etching is unintentionally redeposited on a surrounding conductor and/or insulator. On the other hand, the larger the angle of the ion beam relative to the z-axis, the more likely the ion beam is disturbed by the mask patterns 31 and does not reach deeper positions (i.e., positions closer to the substrate 2). Accordingly, a layer closer to the substrate 2 cannot be etched. To etch the layer closer to the substrate 2, each opening 32 (specifically, the distance D2 between adjacent mask patterns 31) is required to be wide. In this manner, a trade-off limits the angle of the ion beam. Therefore, the angle of the ion beams is determined in consideration of an amount of redeposition, the distance D2 between adjacent mask patterns 31, and the thickness of a to-be-etched object. The etching is carried out under a condition that causes slight overetching so that the ion beam reliably reaches the entire side surface of the ferromagnet 21a in order to form the ferromagnet 21a into a shape of the ferromagnet 21 (see FIG. 1).

The IBE does not need to etch the conductor 14a, the layer 15a, and the conductor 16a. Accordingly, the ion beams do not need to reach the bottom surface of the conductor 14a and may be emitted at an angle which does not satisfy this requirement.

Figure 7:
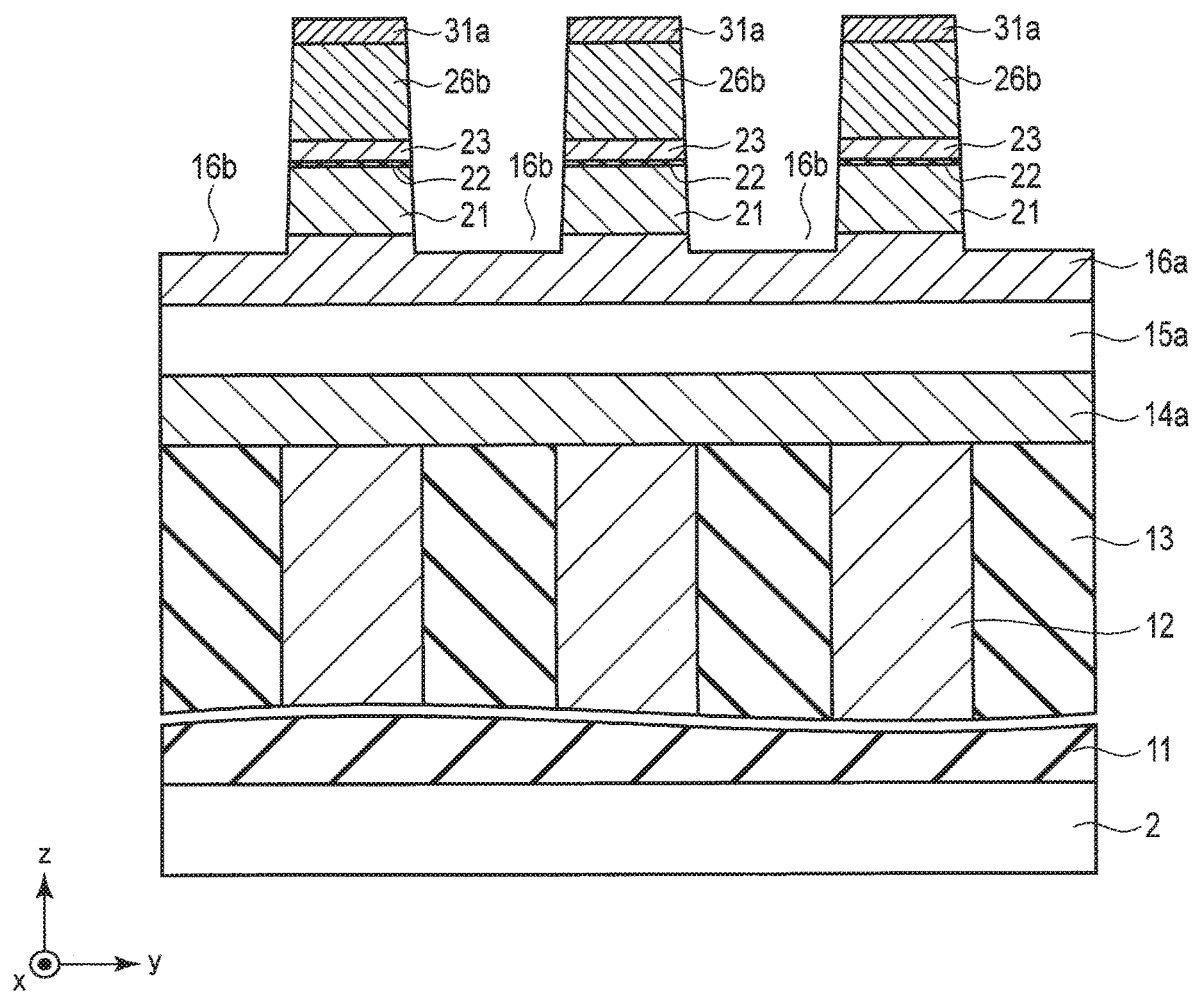
FIG. 7 shows a state subsequent to FIG. 6 during the manufacturing process of the magnetoresistive memory device according to the first embodiment.

As shown in FIG. 7, the etching shown in FIG. 6 is continued so as to process the ferromagnet 21a, the nonmagnet 22a, and the ferromagnet 23a into ferromagnets 21, nonmagnets 22, and ferromagnets 23, respectively. The etching processes the conductor 26a into isolated portions 26b, and the mask patterns 31 into isolated portions 31a. As a result of the etching, the portions 31a have upper surfaces lower than the mask patterns 31. Furthermore, the etching slightly lowers an upper surface of the conductor 16a in each area between adjacent ferromagnets 21, whereby forming recesses 16b in the lowered portions. Side surfaces of each portion 31a, portion 26b, ferromagnet 23, nonmagnet 22, ferromagnet 21, and recess 16b are continuous, and the continuum of these side surfaces have a tapered shape.

The physical etching shown in FIGS. 6 and 7 may involve two or more types of physical etching, such as IBE, with different conditions. Any employed type of etching does not need to etch a layer lower than the ferromagnet 21a.

Figure 8:
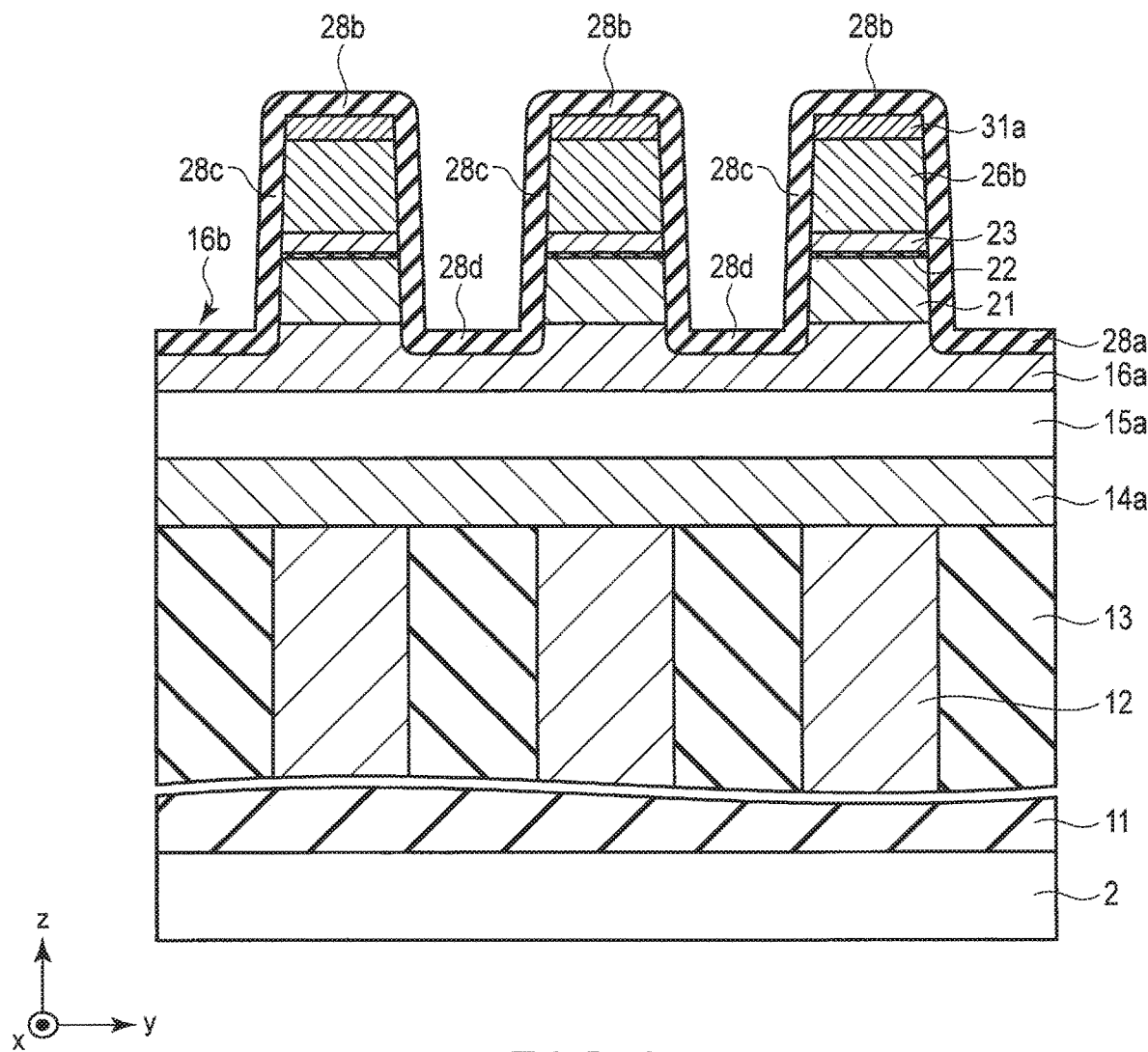
FIG. 8 shows a state subsequent to FIG. 7 during the manufacturing process of the magnetoresistive memory device according to the first embodiment.

As shown in FIG. 8, an insulator 28a is deposited on the entire upper surface of the structure obtained so far in the manufacturing process. The insulator 28a covers the upper surfaces and the side surfaces of the portion 31a of mask patterns 31, the side surfaces of the portions 26b of conductors 26a, the side surfaces of ferromagnets 23, the side surfaces of nonmagnets 22, the side surfaces of ferromagnets 21, and inner surfaces of recesses 16b. The insulator 28a includes portions 28b, portions 28c, and portions 28d. Each portion 28b covers the upper surface of the portion 31a of each mask pattern 31. Each portion 28c covers the side surface of the portion 31a of each mask pattern 31, the side surface of the portion 26b of each conductor 26a, the side surface of each ferromagnet 23, the side surface of each nonmagnet 22, and the side surface of each ferromagnet 21. Each portion 28d covers the inner surface of each recess 16b.

Figure 9:
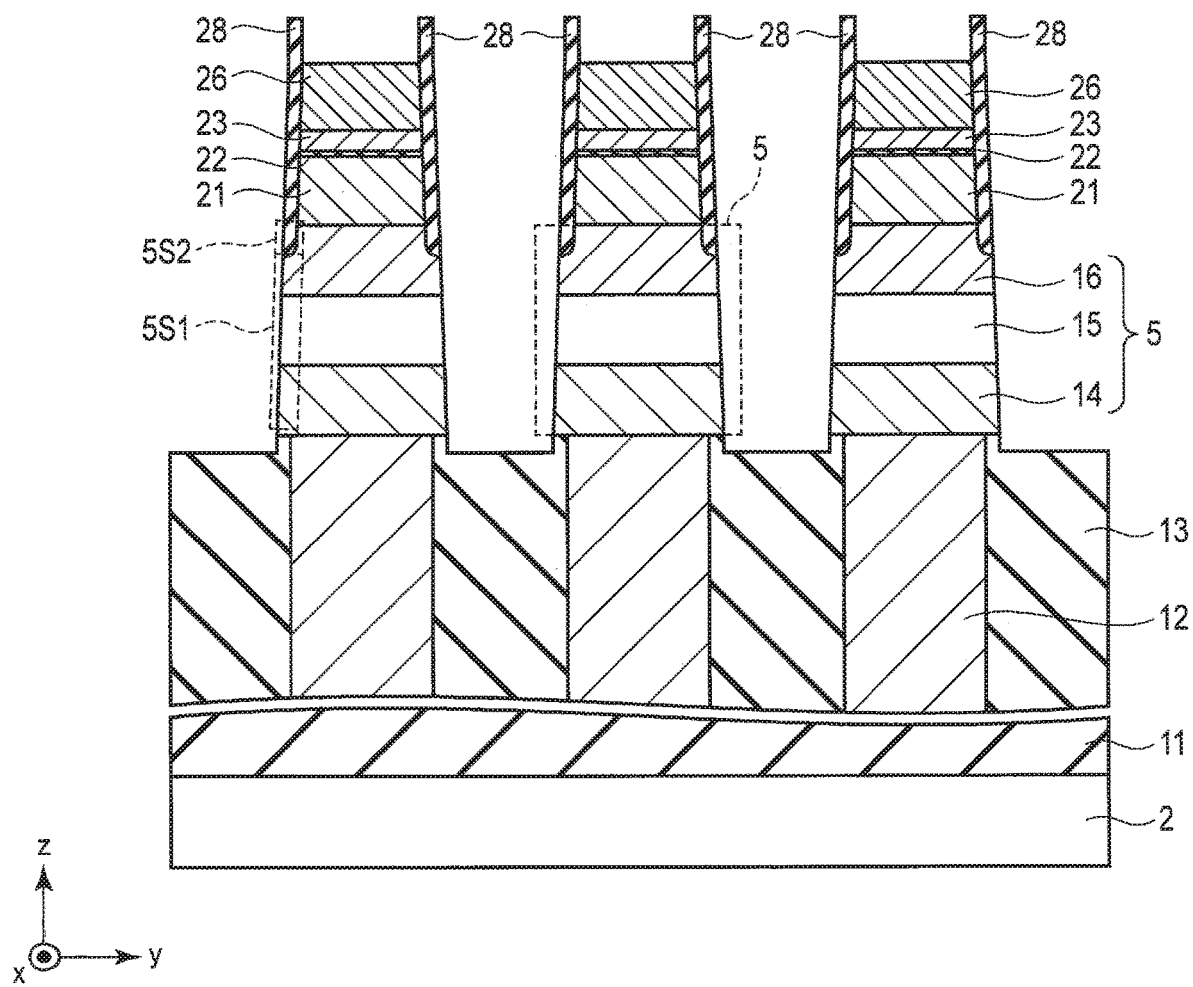
FIG. 9 shows a state subsequent to FIG. 8 during the manufacturing process of the magnetoresistive memory device according to the first embodiment.

As shown in FIG. 9, the structure obtained so far in the manufacturing process is an object of interest of the second type etching. The second type etching enables formation of a structure with a high aspect ratio or at least formation of a structure with an aspect ratio higher than that obtained by the first type etching. The second type etching involves, for example, RIE. The RIE is performed to process the conductor 14a, the layer 15a, and the conductor 16a into separate sets of the conductor 14, the switching element 15, and the conductor 16. The RIE removes the following portions in the structure of interest. First, the RIE removes the portions 28b (not shown) of the insulator 28a and the portions 31a of the mask patterns 31, and lowers the upper surface of the portions 26b, whereby forming the capping films 26. In addition, the RIE thins the portions 28c of the insulator 28a, whereby forming the insulators 28. Moreover, the RIE removes the portions 28d of the insulator 28a, and then, etches the conductor 14a, the layer 15a, and the conductor 16a from portions where the portions 28d are removed. As a result of the etching, the conductor 14a, the layer 15a, and the conductor 16a are processed into layer stacks 5 (the conductors 14, the switching elements 15, and the conductors 16).

The surface of each insulator 28, side surfaces of the corresponding conductor 14 and the switching element 15, and a lower side surface of the corresponding conductor 16 are continuous, and each insulator 28 is placed on an upper side surface of the corresponding conductor 16. Accordingly, the side surface of the conductor 16 has a diameter smaller in its upper section than in the lower section. In other words, the first section 5S1 and the second section 5S2 on the side surface of each layer stack 5 are formed by the RIE.

Generally, RIE deteriorates magnetic properties of a material exposed to RIE. During the RIE shown in FIG. 9, the side surface of each MTJ element 4 is covered with the insulator 28. This makes it possible to suppress or avoid deterioration of the properties of the MTJ elements 4 due to an influence, attributed to the RIE, from the side surface of the MTJ element 4.

The RIE shown in FIG. 9 may involve two or more types of RIE with different conditions.

As shown in FIG. 1, the conductor 29 is formed on each capping film 26, and the insulator 30 is formed.

According to the first embodiment, it is possible to densely form the memory cells 3 each having a high aspect ratio and including the MTJ element 4 with good properties. The details are as follows. Aiming at formation of the MTJ elements 4 and the layer stacks 5 as shown in FIG. 2 from the conductor 14a, the layer 15a, the conductor 16a, the ferromagnet 21a, the nonmagnet 22a, and the ferromagnet 23a in the structure shown in FIG. 6, one (one type of) etching may be performed on the structure shown in FIG. 6 so as to form the conductor 14a, the layer 15a, the conductor 16a, the ferromagnet 21a, the nonmagnet 22a, and the ferromagnet 23a. Examples of etching include RIE and IBE. However, as described below, either technique cannot form high-density memory cells each having a high aspect ratio and including an MTJ element with good properties.

Using IBE can form an MTJ element having properties better than an MTJ element formed by RIE. However, an ion beam having a high angle relative to the z-axis, which is necessary to avoid redeposition, does not reach several lower components in the openings 32, such as, the layer 15a and the conductor 14a, as shown in FIG. 10. Accordingly, the conductor 14a and the layer 15a which lie at deeper positions cannot be etched. The larger the openings 32 are (specifically, the distance D2 between the mask patterns 31), the more likely the ion beam reaches deeper positions of the openings 32. However, a necessity of a large distance D2 between the mask patterns 31 hinders a reduction in the distance between the memory cells 3. Particularly, the memory cells 3 cannot be formed at narrow distances, such as distances which allows the ratio L1/D1 to exceed 1.

When narrow openings 32 are used to make high-density memory cells, the ion beam must have a lower angle relative to the z-axis so that the ion beam reaches lower positions of the small openings 32. An ion beam with a low angle leads to a large amount of redeposition, and a large amount of redeposition may lead to electrical conduction of the ferromagnets 21 and 23 due to redeposited materials on the side surfaces of the ferromagnets 21 and 23. Such a set of ferromagnets 21 and 23 can no longer function as a part of the MTJ element 4.

On the other hand, using RIE can etch a conductor and/or an insulator at a lower position that ion beam with an angle that enables suppression of redeposition does not reach, such as the layer 15a and the conductor 14a. However, when a magnet is exposed to RIE, magnetic properties of the magnet may be deteriorated. When magnetic properties of the ferromagnets 21 and 23 are greatly deteriorated by RIE, the MTJ elements 4 may not have desired properties.

According to the first embodiment, the ferromagnet 21a, the nonmagnet 22a, and the ferromagnet 23a are etched by IBE, which causes little deterioration of a to-be-etched object, and the conductor 14a, the layer 15a, and the conductor 16a are etched by RIE, which enables formation of a structure with a high aspect ratio. Etching by IBE does not give damage to the ferromagnet 21a, the nonmagnet 22a, and the ferromagnet 23a damage that would be caused when the ferromagnet 21a, the nonmagnet 22a, and the ferromagnet 23a are etched by RIE. Accordingly, the MTJ elements 4 be formed with better performance than in the case of etching by RIE.

In addition, the conductor 14a, the layer 15a, and the conductor 16a are processed by RIE, and therefore the conductor 14a, the layer 15a, and the conductor 16a do not need to be etched by IBE. Thus, the ion beam does not need to have a high angle, that would be required for etching the conductor 14a, the layer 15a, and the conductor 16a through the small openings 32 of the mask material 33. This can avoid redeposition due to the ion beam having a high angle, which enables formation of the MTJ elements 4 with good performance. Since the conductor 14a, the layer 15a, and the conductor 16a do not need to be etched by IBE, the ion beam may have a high angle as long as the ferromagnet 21a, the nonmagnet 22a, and the ferromagnet 23a are processed and the amount of redeposition is within an acceptable level. An ion beam with a higher angle allows for a small distance D2 between the mask patterns 31. A smaller distance D2 enables formation of a denser memory cell 3. In other words, a high-density magnetoresistive memory device 1 can be formed.

A structure including the memory cells 3 including such MTJ elements 4 only slightly deteriorated during while being formed and the capping films 26 can have an aspect ratio of more than 1, or even 3 or more.

According to the first embodiment, the magnetoresistive memory device 1 during manufacture is subjected to RIE after processing of the MTJ elements 4. However, the upper surfaces of the MTJ elements 4 are covered with the capping films 26, and the side surfaces of the MTJ elements 4 are covered with the portions 28b of the insulator 28. This suppresses or avoids deterioration of the MTJ elements 4 due to RIE.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for manufacturing a magnetoresistive memory device, the method comprising:
   forming a first conductor over a substrate;
   forming a first layer stack on the first conductor, the first layer stack including a switching element;
   forming a second layer stack on the first layer stack, the second layer stack including a first ferromagnet;
   forming a mask above the second layer stack, the mask including a first portion and an opening;
   etching the second layer stack with an ion beam that travels through the opening to form a third layer stack;
   forming an insulator which continuously covers a side surface of the third layer stack and a portion of a side surface of the first layer stack; and
   etching the first layer stack by reactive ion etching through the opening to form a fourth layer stack, the fourth layer stack having a smaller diameter in an upper section thereof than a diameter in a lower section thereof such that the insulator and the lower section of the fourth layer stack form a continuous surface,
   wherein the first layer stack includes a second conductor in a top portion of the first layer stack, and the forming of the insulator includes forming the insulator which continuously covers the side surface of the third layer stack and a portion of a side surface of the second conductor,
   wherein the forming of the insulator includes forming the insulator which continuously covers the side surface of the third layer stack and the portion of the side surface of the second conductor except a side surface of the switching element.

2. The method according to claim 1, wherein:
   the etching of the second layer stack includes forming, in the second layer stack, a hole through the second layer stack from an upper surface to a lower surface of the second layer stack to form the third layer stack from the second layer stack.

3. The method according to claim 1, wherein:
   the etching of the first layer stack includes forming, in the first layer stack, a hole through the first layer stack from an upper surface to a lower surface of the first layer stack.

4. The method according to claim 1, wherein:
   the ion beam has a first angle relative to an axis perpendicular to a surface of the substrate.

5. The method according to claim 4, wherein:
   the first angle has a magnitude with which the ion beam is blocked by the mask and does not reach a lower surface of the first layer stack inside the opening.

6. The method according to claim 1, wherein:
   L/D >1 is satisfied where D represents a distance between a lower surface of the fourth layer stack and a lower surface of a fifth layer stack adjacent to the fourth layer stack, and L represents a length from an upper surface of the second layer stack to the lower surface of the first layer stack.

7. The method according to claim 6, wherein:
   the second layer stack includes the first ferromagnet, a second ferromagnet, a nonmagnet between the first ferromagnet and the second ferromagnet.

8. The method according to claim 1, wherein:
   when a voltage lower than a first value is applied to the switching element, the switching element exhibits a first resistance, and when a voltage equal to or higher than the first value is applied to the switching element, the switching element exhibits a second resistance.

9. The method according to claim 1, wherein the forming of the first layer stack includes:
   forming a second conductor on the first conductor,
   forming the switching element on the second conductor, and
   forming a third conductor on the switching element.

10. The method according to claim 9, wherein:
    the forming of the first conductor includes forming two first conductors separated from each other,
    the second conductor is formed to extend on upper surfaces of the first conductors,
    the etching of the first layer stack includes partially removing the first layer stack in an area over an area between the first conductors.

11. The method according to claim 1, wherein:
    the etching of the second layer stack includes etching a part of a top surface of the first layer stack to expose the portion of the side surface of the first layer stack in the opening.

12. The method according to claim 11, wherein:
    the forming of the insulator includes forming the insulator further on the part of the top surface of the first layer stack in the opening, and
    the etching of the first layer stack includes etching a part of the insulator on the part of the top surface of the first layer stack.

13. The method according to claim 12, wherein:
    the etching of the first layer stack uses a part of the insulator on the side surface of the third layer stack as a mask.

14. The method according to claim 1, wherein:
    the second conductor is on the switching element.

15. The method according to claim 1, wherein:
    the etching of the second layer stack with the ion beam is performed by a first etching method that enables formation of a structure with a first aspect ratio,
    the etching of the first layer stack by the reactive ion etching is performed by a second etching method that enables formation of a structure with a second aspect ratio, and
    the second aspect ratio is higher than the first aspect ratio.

16. The method according to claim 1, wherein:
    the third layer stack has an aspect ratio lower than an aspect ratio of the fourth layer stack.

* * * * *